(12) United States Patent
Heeney et al.

(10) Patent No.: US 7,470,377 B2
(45) Date of Patent: Dec. 30, 2008

(54) MONOMERS, OLIGOMERS AND POLYMERS COMPRISING THIOPHENE AND SELENOPHENE

(75) Inventors: Martin Heeney, Southampton (GB); Steven Tierney, Southampton (GB); Warren Duffy, Southampton (GB); Iain McCulloch, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 283 days.

(21) Appl. No.: 11/373,491

(22) Filed: Mar. 13, 2006

(65) Prior Publication Data

US 2006/0249712 A1    Nov. 9, 2006

Related U.S. Application Data

(60) Provisional application No. 60/661,490, filed on Mar. 15, 2005.

(30) Foreign Application Priority Data

Mar. 11, 2005  (EP) .................................. 05005348
Mar. 14, 2005  (EP) .................................. 05005467

(51) Int. Cl.
*C09K 19/00*  (2006.01)
*C09K 19/52*  (2006.01)
(52) U.S. Cl. ...................... 252/299.01; 428/1.1; 430/20
(58) Field of Classification Search .................. 430/20, 430/270.1; 252/299.01; 428/1.1
See application file for complete search history.

(56) References Cited

U.S. PATENT DOCUMENTS 6,695,978 B2 *  2/2004  Worrall et al. ......... 252/299.62
6,805,922 B2 * 10/2004  Heeney et al. ............... 428/1.1

* cited by examiner

*Primary Examiner*—Geraldina Visconti
(74) *Attorney, Agent, or Firm*—Millen, White, Zelano & Branigan, P.C.

(57) ABSTRACT

The invention relates to novel mono-, oligo- and polymeric compounds comprising thiophene and selenophene, to their use as semiconductors or charge transport materials, in optical, electro-optical or electronic devices, and to optical, electro-optical or electronic devices comprising the novel compounds.

38 Claims, 1 Drawing Sheet

Figure 1

MONOMERS, OLIGOMERS AND POLYMERS COMPRISING THIOPHENE AND SELENOPHENE

This application claims the benefit of U.S. Provisional Patent Application 60/661,490, filed Mar. 15, 2005, the entire disclosure of which is hereby incorporated by reference.

FIELD OF INVENTION

The invention relates to novel mono-, oligo- and polymeric compounds comprising thiophene and selenophene. The invention further relates to their use as semiconductors or charge transport materials, in optical, electro-optical or electronic devices. The invention further relates to optical, electro-optical or electronic devices comprising the novel compounds.

BACKGROUND AND PRIOR ART

Organic materials have recently shown promise as the active layer in organic based thin film transistors and organic field effect transistors [see H. E. Katz, Z. Bao and S. L. Gilat, *Acc. Chem. Res.*, 2001, 34, 5, 359]. Such devices have potential applications in smart cards, security tags and the switching element in flat panel displays. Organic materials are envisaged to have substantial cost advantages over their silicon analogues if they can be deposited from solution, as this enables a fast, large-area fabrication route.

The performance of the device is principally based upon the charge carrier mobility of the semi-conducting material and the current on/off ratio, so the ideal semiconductor should have a low conductivity in the off state, combined with a high charge carrier mobility ($>1 \times 10^{-3}$ cm$^2$V$^{-1}$s$^{-1}$). In addition, it is important that the semi-conducting material is relatively stable to oxidation i.e. it has a high ionization potential, as oxidation leads to reduced device performance.

Regioregular head-to-tail poly(3-hexylthiophene) has been reported with charge carrier mobility between $1 \times 10^{-5}$ and $4.5 \times 10^{-2}$ cm$^2$V$^{-1}$s$^{-1}$, but with a rather low current on/off ratio between 10 and 10$^3$ [see Z. Bao et al., *Appl. Pys. Lett.*, 1996, 69, 4108]. This low on/off current is due in part to the low ionization potential of the polymer, which can lead to oxygen doping of the polymer under ambient conditions, and a subsequent high off current [see H. Sirringhaus et al., *Adv. Solid State Phys.*, 1999, 39, 101].

A high regioregularity leads to improved packing and optimized microstructure, leading to improved charge carrier mobility [see H. Sirringhaus et al., *Science*, 1998, 280, 1741-1744; H. Sirringhaus et al., *Nature*, 1999, 401, 685-688; and H. Sirringhaus, et al., *Synthetic Metals*, 2000, 111-112, 129-132]. In general, poly(3-alkylthiophenes) show improved solubility and are able to be solution processed to fabricate large area films. However, poly(3-alkylthiophenes) have relatively low ionization potentials and are susceptible to doping in air.

It is an aim of the present invention to provide new materials for use as semiconductors or charge transport materials, which are easy to synthesize, have high charge mobility, good processibility and oxidative stability. Another aim of the invention is to provide new semiconductor and charge transport components, and new and improved electrooptical, electronic and luminescent devices comprising these components. Other aims of the invention are immediately evident to those skilled in the art from the following description.

The inventors have found that these aims can be achieved by providing mono-, oligo- and polymers of bis(thienyl) selenophene as claimed in the present invention.

EP-A-1 439 590 discloses mono-, oligo- and poly-bis(thienyl) arylenes, but does not disclose compounds of the present invention. S. Tierney, M. Heeney and I. McCulloch, *Synth Met.*, 148(2), 195-198, (2005) discloses poly-bis(3-octyl-thiophen-2-yl) selenophene, but does not disclose compounds of the present invention.

SUMMARY OF THE INVENTION

The invention relates to monomeric, oligomeric or polymeric compounds comprising one or more selenophene-2,5-diyl groups and one or more thiophene 2,5-diyl groups, each being optionally substituted in 3- and/or 4-position.

According to a further aspect, the invention relates to monomeric, oligomeric or polymeric compounds comprising one or more selenophene-2,5-diyl groups and one or more thiophene 2,5-diyl groups, each being optionally substituted in 3- and/or 4-position, with the proviso that homopolymers of 2,5-bis(3-octyl-thiophen-2-yl)selenophene are excluded.

The invention further relates to a use of the compounds of formula I as semiconducting, charge transport or light-emitting materials.

The invention further relates to a semiconducting, electroluminescent or charge transport material, component or device comprising at least one compound of formula I.

The invention further relates to the use of compounds of formula I as charge-transport, semiconducting, electrically conducting, photoconducting or light-emitting material in optical, electrooptical or electronic components or devices, organic field effect transistors (OFET), integrated circuitry (IC), thin film transistors (TFT), flat panel displays, radio frequency identification (RFID) tags, electroluminescent or photoluminescent devices or components, organic light emitting diodes (OLED), backlights of displays, photovoltaic or sensor devices, charge injection layers, Schottky diodes, planarizing layers, antistatic films, conducting substrates or patterns, electrode materials in batteries, photoconductors, electrophotographic applications, electrophotographic recording, organic memory devices, alignment layers, cosmetic or pharmaceutical compositions, biosensors, biochips, or for detecting and discriminating DNA sequences.

The invention further relates to an optical, electrooptical or electronic device, field effect transistors (FET), integrated circuit (IC), TFT, OLED or alignment layer comprising a compound, semiconducting or charge transport material, component or device according to the invention.

The invention further relates to a TFT or TFT array for flat panel displays, radio frequency identification (RFID) tag, electroluminescent display or backlight comprising a compound, semiconducting or charge transport material, component or device or a FET, IC, TFT or OLED according to the invention.

The invention further relates to a security marking or device comprising a FET or an RFID tag according to the invention.

BRIEF DESCRIPTION OF THE DRAWINGS

Various other features and attendant advantages of the present invention will be more fully appreciated as the same becomes better understood when considered in conjunction with the accompanying drawing wherein.

DETAILED DESCRIPTION OF THE INVENTION

The polymers according to the present invention can be homopolymers, i.e. having identical recurring units, or copolymers having different recurring units. Particularly preferred are homopolymers having identical recurring units.

The compounds of the present invention are advantageous because they exhibit higher charge carrier mobilities compared to the analogous all-thiophene systems. The increased atomic radius of selenium (103 pm (picometer)) over sulfur (88 pm) enhances molecular overlaps between polymer chains, and facilitates the charge hopping process. In addition the inclusion of selenophene results in a red-shift of the maximum absorbance wavelength over the all-thiophene systems.

The compounds according to the invention are especially useful as charge transport or semiconductor materials. Introduction of alkyl side chains into the thiophene and/or selenophene group further improves solubility and solution processibility especially for the polymers.

The regioregularity in the polymers of the present invention is preferably at least 90%, in particular 95% or more, very preferably 98% or more, most preferably from 99 to 100%.

Regioregular polymers are advantageous as they show strong interchain pi-pi-stacking interactions and a high degree of crystallinity, making them effective charge transport materials with high carrier mobilities.

Further preferred are mono-, oligo- and polymers that are mesogenic or liquid crystalline, in particular polymers forming calamitic phases, and polymerizable monomers comprising one or more groups P-Sp- and forming calamitic phases.

The monomeric, oligomeric and polymeric compounds are preferably selected of formula I

I wherein $R^{1-6}$ are independently of each other, and in case of multiple occurrence independently of one another, H, halogen, optionally substituted aryl or heteroaryl, P-Sp-, P*-Sp-, or straight chain, branched or cyclic alkyl with 1 to 20 C-atoms which is optionally mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —O—CO—O—, —S—CO—, —CO—S—, —$CX^1$=$CX^2$— or —C≡C— in such a manner that O and/or S atoms are not linked directly to one another, $R^0$ and $R^{00}$ are independently of each other H, aryl or alkyl with 1 to 12 C-atoms, $X^1$ and $X^2$ are independently of each other H, F, Cl or CN, P is a polymerizable group, P* is a group that can be converted to or substituted by a polymerizable group P, Sp is a spacer group or a single bond, a, b, c and d are independently of each other 0, 1, 2 or 3, with a+c>1 and b+d>1, n is an integer ≧1, wherein the recurring units are identical or different.

According to a further aspect of the invention, the monomeric, oligomeric and polymeric compounds are selected from formula I with the proviso that compounds wherein a=b=c=1, d=0, $R^1$ and $R^2$ are n-$C_8H_{17}$, $R^3$, $R^4$, $R^5$ and $R^6$ are H, and n>1 are excluded.

Especially preferred are compounds of formula I1

I1 wherein $R^{1-6}$, a, b, c, d and n have the meanings of formula I, $R^7$ and $R^8$ independently of each other have one of the meanings of $R^1$ or denote —$Sn(R^0)_3$, —B(OR')(OR"), —$CH_2Cl$, —CHO, —CH=$CH_2$ or —$SiR^0R^{00}R^{000}$, $R^0$, $R^{00}$, $R^{000}$ are independently of each other H, aryl or alkyl with 1 to 12 C-atoms, R' and R" are independently of each other H or alkyl with 1 to 12 C-atoms, or OR' and OR" together with the boron atom form a cyclic group having 2 to 20 C atoms.

According to a further aspect of the invention, the monomeric, oligomeric and polymeric compounds are selected from formula I1 with the proviso that compounds wherein a=b=c=1, d=0, $R^1$ and $R^2$ are n-$C_8H_{17}$, $R^3$, $R^4$, $R^5$ and $R^6$ are H, and n>1 are excluded.

Further preferred are compounds of formula I and I1 wherein n is an integer from 2 to 5000, preferably from 10 to 5000, very preferably from 100 to 1000, the molecular weight (Mw) is from 5000 to 300,000, in particular from 20,000 to 100,000, n is 1, a and/or c is 1, b is 1 or 2, d is 0, a=c=1, b=1 or 2, d=0, a=c=1, b=d=1, b=d=1, c=1 or 2, a=0, a=b=1, c=d=0, $R^1$, $R^2$, $R^3$, $R^4$, $R^5$ and $R^6$ are independently of each other, and in case of multiple occurrence independently of one another, H, halogen, optionally substituted aryl or heteroaryl, P-Sp-, or straight chain, branched or cyclic alkyl with 1 to 20 C-atoms which is optionally mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —O—CO—O—, —S—CO—, —CO—S—, —$CX^1$=$CX^2$— or —C≡C— in such a manner that O and/or S atoms are not linked directly to one another, At least one of $R^1$, $R^2$, $R^3$, $R^4$, $R^5$ and $R^6$ is halogen, optionally substituted aryl or heteroaryl, P-Sp-, or straight chain, branched or cyclic alkyl with 1 to 20 C-atoms which is optionally mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —O—CO—O—, —S—CO—, —CO—S—, —$CX^1$=$CX^2$— or —C≡C— in such a manner that O and/or S atoms are not linked directly to one another, $R^1$, $R^2$, $R^3$, $R^4$, $R^5$ and $R^6$ are independently of each other halogen, optionally substituted aryl or heteroaryl, P-Sp-, P*-Sp-, or straight chain, branched or cyclic alkyl with 9 to 20 C-atoms, which is optionally mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —O—CO—O—, —S—CO—, —CO—S—, —$CX^1$=$CX^2$— or —C≡C— in such a manner that O and/or S atoms are not linked directly to one another, At least one of $R^1$, $R^2$, $R^3$, $R^4$, $R^5$ and $R^6$ is halogen, optionally substituted aryl or heteroaryl, P-Sp-, P*-Sp-, or straight chain, branched or cyclic alkyl with 9 to 20 C-atoms, which is optionally mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —O—CO—O—, —S—CO—, —CO—S—, —$CX^1$=$CX^2$— or —C≡C— in such a manner that O and/or S atoms are not linked directly to one another, $R^3$, $R^4$, $R^5$ and $R^6$ are H, $R^1$ and $R^2$ are different from H, $R^1$ and $R^2$ are identical, $R^1$ and $R^2$ are selected from $C_1$-$C_{20}$-alkyl, $C_1$-$C_{20}$-alkoxy, $C_2$-$C_{20}$-alkenyl, $C_2$-$C_{20}$-alkynyl, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, and optionally substituted aryl or heteroaryl, very preferably $C_1$-$C_{20}$-alkyl or $C_1$-$C_{20}$-fluoroalkyl, $R^1$ and $R^2$ are selected from $C_9$-$C_{20}$-alkyl, $C_9$-$C_{20}$-alkoxy, $C_9$-$C_{20}$-alkenyl, $C_9$-$C_{20}$-alkynyl, $C_9$-$C_{20}$-thioalkyl, $C_9$-$C_{20}$-silyl, $C_9$-$C_{20}$-ester, $C_9$-$C_{20}$-amino, $C_9$-$C_{20}$-fluoroalkyl, and optionally substituted aryl or heteroaryl, very preferably $C_9$-$C_{20}$-alkyl or $C_9$-$C_{20}$-fluoroalkyl, most preferably $C_{10}$-$C_{20}$-alkyl or $C_{10}$-$C_{20}$-fluoroalkyl, $R^1$, $R^2$, $R^5$ and $R^6$ are H, $R^3$ and $R^4$ are different from H, $R^3$ and $R^4$ are identical, $R^3$ and $R^4$ are selected from $C_1$-$C_{20}$-alkyl, $C_1$-$C_{20}$-alkoxy, $C_2$-$C_{20}$-alkenyl, $C_2$-$C_{20}$-alkynyl, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, and optionally substituted aryl or heteroaryl, very preferably $C_1$-$C_{20}$-alkyl or $C_1$-$C_{20}$-fluoroalkyl, $R^3$ and $R^4$ are selected from $C_9$-$C_{20}$-alkyl, $C_9$-$C_{20}$-alkoxy, $C_9$-$C_{20}$-alkenyl, $C_9$-$C_{20}$-alkynyl, $C_9$-$C_{20}$-thioalkyl, $C_9$-$C_{20}$-silyl, $C_9$-$C_{20}$-ester, $C_9$-$C_{20}$-amino, $C_9$-$C_{20}$-fluoroalkyl, and optionally substituted aryl or heteroaryl, very preferably $C_9$-$C_{20}$-alkyl or $C_9$-$C_{20}$-fluoroalkyl, most preferably $C_{10}$-$C_{20}$-alkyl or $C_{10}$-$C_{20}$-fluoroalkyl, $R^1$, $R^2$, $R^3$ and $R^4$ are H, $R^5$ and $R^6$ are different from H, $R^5$ and $R^6$ are identical, $R^5$ is H and $R^6$ is different from H, $R^6$ is H and $R^5$ is different from H, $R^5$ and/or $R^6$ are selected from $C_1$-$C_{20}$-alkyl, $C_1$-$C_{20}$-alkoxy, $C_2$-$C_{20}$-alkenyl, $C_2$-$C_{20}$-alkynyl, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, and optionally substituted aryl or heteroaryl, very preferably $C_1$-$C_{20}$-alkyl or $C_1$-$C_{20}$-fluoroalkyl, $R^5$ and/or $R^6$ are selected from $C_9$-$C_{20}$-alkyl, $C_9$-$C_{20}$-alkoxy, $C_9$-$C_{20}$-alkenyl, $C_9$-$C_{20}$-alkynyl, $C_9$-$C_{20}$-thioalkyl, $C_9$-$C_{20}$-silyl, $C_9$-$C_{20}$-ester, $C_9$-$C_{20}$-amino, $C_9$-$C_{20}$-fluoroalkyl, and optionally substituted aryl or heteroaryl, very preferably $C_9$-$C_{20}$-alkyl or $C_9$-$C_{20}$-fluoroalkyl, most preferably $C_{10}$-$C_{20}$-alkyl or $C_{10}$-$C_{20}$-fluoroalkyl, P* is —OH or —O—Si—$R^0R^{00}R^{000}$, preferably wherein $R^0$, $R^{00}$ and $R^{000}$ are identical or different groups selected from aryl or $C_{1-12}$-alkyl, preferably $C_1$-$C_6$-alkyl, like methyl, ethyl, isopropyl, tert-butyl or phenyl, $R^7$ and $R^8$ are selected from H, halogen, $Sn(R^0)_3$, B(OR')(OR"), $CH_2Cl$, CHO, CH=$CH_2$, $SiR^0R^{00}R^{000}$ and optionally substituted aryl or heteroaryl, n is 1 and one or both of $R^7$ and $R^8$ are halogen which is preferably Br, Cl or I, $Sn(R^0)_3$, B(OR')(OR"), $CH_2Cl$, CHO, CH=$CH_2$ or $SiR^0R^{00}R^{000}$, at least one of $R^1$, $R^2$, $R^3$, $R^4$, $R^5$ and $R^6$ is P-Sp-, n is 1 and one or both of $R^7$ and $R^8$ is P-Sp- or P*-Sp-, n is 1 and one or both of $R^7$ and $R^8$ is P-Sp-.

Especially preferred are compounds of the following formulae

IIa

IIb

IIc

IId wherein $R^{1-8}$ and n have the meanings of formula I1.

According to a further aspect of the invention, the monomeric, oligomeric and polymeric compounds are selected from formulas I1a-I1f with the proviso that compounds wherein a=b=c=1, d=0, $R^1$ and $R^2$ are n-$C_8H_{17}$, $R^3$, $R^4$, $R^5$ and $R^6$ are H, and n>1 are excluded.

Especially preferred are the following compounds wherein n has the meaning of formula I and R has one of the meanings of $R^1$ in formula I different from H.

According to a further aspect of the invention, the monomeric, oligomeric and polymeric compounds are selected from formulas I1a1, I1a2, I1c1, and I1c2, with the proviso that compounds wherein a=b=c=1, d=0, $R^1$ and $R^2$ are n-$C_8H_{17}$, $R^3$, $R^4$, $R^5$ and $R^6$ are H, and n>1 are excluded.

If one of $R^{1-8}$ is aryl or heteroaryl, it is preferably a mono-, bi- or tricyclic aromatic or heteroaromatic group with up to 25 C atoms, wherein the rings can be fused. Heteroaromatic groups contain at least one hetero ring atom preferably selected from N, O and S. The aromatic or heteroaromatic groups are optionally substituted with one or more groups L. Preferred are heteroaromatic groups containing 1,2, or 3 hetero atoms, very preferred are groups containing 1 or 2 hetero atoms.

L is F, Cl, Br, I, CN or straight chain, branched or cyclic alkyl having 1 to 20 C atoms, which is unsubstituted, mono- or poly-substituted by F, Cl, Br, I, —CN or —OH, and in which one or more non-adjacent $CH_2$ groups are optionally replaced, in each case independently from one another, by —O—, —S—, —NH—, —$NR^0$—, —$SiR^0R^{00}$—, —CO—, —COO—, OCO—, —OCO—O, —S—CO—, —CO—S—, —CH=CH— or —C≡C— in such a manner that O and/or S atoms are not linked directly to one another.

Especially preferred aryl and heteroaryl groups are phenyl, fluorinated phenyl, pyridine, pyrimidine, biphenyl, naphthalene, optionally fluorinated or alkylated or fluoroalkylated benzo[1,2-b:4,5-b']dithiophene, optionally fluorinated or alkylated or fluoroalkylated thieno[3,2-b]thiophene, optionally fluorinated or alkylated or fluoroalkylated 2,2-dithiophene, thiazole and oxazole, all of which are unsubstituted, mono- or polysubstituted with L as defined above.

If one of $R^{1-8}$ is an alkyl or alkoxy radical, i.e. where the terminal $CH_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example.

Fluoroalkyl or fluorinated alkyl or alkoxy is preferably straight chain (O)$C_iF_{2i+1}$, wherein i is an integer from 1 to 20, in particular from 1 to 15, very preferably (O)$CF_3$, (O)$C_2F_5$, (O)$C_3F_7$, (O)$C_4F_9$, (O)$C_5F_{11}$, (O)$C_6F_{13}$, (O)$C_7F_{15}$ or (O)$C_8F_{17}$, most preferably (O)$C_6F_{13}$.

$CX^1=CX^2$ is preferably —CH=CH—, —CH=CF—, —CF=CH—, —CF=CF—, —CH=C(CN)— or —C(CN)=CH—.

Halogen is preferably F, Br or Cl.

Hetero atoms are preferably selected from N, O and S.

The polymerizable group P is a group that is capable of participating in a polymerization reaction, like radicalic or ionic chain polymerization, polyaddition or polycondensation, or capable of being grafted, for example by condensation or addition, to a polymer backbone in a polymeranaloguous reaction. Especially preferred are polymerizable groups for chain polymerization reactions, like radicalic, cationic or anionic polymerization. Very preferred are polymerizable groups comprising a C—C double or triple bond, and polymerizable groups capable of polymerization by a ring-opening reaction, like oxetanes or epoxides.

Very preferably the polymerizable group P is selected from $CH_2=CW^1$—

-continued $CH_2=CW^2—(O)_{k1}—$, $CH_3—CH=CH—O—$, $(CH_2=CH)_2$ $CH—OCO—$, $(CH_2=CH—CH_2)_2CH—OCO—$, $(CH_2=CH)_2CH—O—$, $(CH_2=CH—CH_2)_2N—$, $(CH_2=CH—CH_2)_2N—CO—$, $HO—CW^2W^3—$, $HS—CW^2W^3—$, $HS—CW^2W^3—$, $HW^2N—$, $HO—CW^2W^3—NH—$, $CH_2=CW^1—CO—NH—$, $CH_2=CH—(COO)_{k1}$-Phe-$(O)_{k2}—$, $CH_2=CH—(CO)_{k1}$-Phe-$(O)_{k2}—$, Phe-$CH=CH—$, $HOOC—$, $OCN—$, and $W^4W^5W^6Si—$, with $W^1$ being H, Cl, CN, $CF_3$, phenyl or alkyl with 1 to 5 C-atoms, in particular H, Cl or $CH_3$, $W^2$ and $W^3$ being independently of each other H or alkyl with 1 to 5 C-atoms, in particular H, methyl, ethyl or n-propyl, $W^4$, $W^5$ and $W^6$ being independently of each other Cl, oxaalkyl or oxacarbonylalkyl with 1 to 5 C-atoms, $W^7$ and $W^8$ being independently of each other H, Cl or alkyl with 1 to 5 C-atoms, Phe being 1,4-phenylene that is optionally substituted by one or more groups L as defined above, and $k_1$ and $k_2$ being independently of each other 0 or 1.

Especially preferred groups P are $CH_2=CH—COO—$, $CH_2=C(CH_3)—COO—$, $CH_2=CH—$, $CH_2=CH—O—$, $(CH_2=CH)_2CH—OCO—$, $(CH_2=CH)_2CH—O—$, Very preferred are acrylate and oxetane groups. Oxetanes produce less shrinkage upon polymerization (cross-linking), which results in less stress development within films, leading to higher retention of ordering and fewer defects. Oxetane cross-linking also requires cationic initiator, which unlike free radical initiator is inert to oxygen.

As spacer group Sp all groups can be used that are known for this purpose to the skilled in the art. The spacer group Sp is preferably of formula Sp'-X, such that P-Sp- is P-Sp'-X— and P*-Sp- is P*-Sp'-X-, wherein Sp' is alkylene with up to 20 C atoms which may be unsubstituted, mono- or poly-substituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, X is —O—, —S—, —CO—, —COO—, —OCO—, —O—COO—, —CO—$NR^0$—, —$NR^0$—CO—, —CO—$NR^0$—CO—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^0$—, —$CX^1=CX^2$—, —C≡C—, —CH=CH—COO—, —OCO—CH=CH— or a single bond, and $R^0$, $R^{00}$, $X^1$ and $X^2$ have one of the meanings given above.

X is preferably —O—, —S—, —$OCH_2$—, —$CH_2O$—, —$SCH_2$—, —$CH_2S$—, —$CF_2O$—, —$OCF_2$—, —$CF_2S$—, —$SCF_2$—, —$CH_2CH_2$—, —$CF_2CH_2$—, —$CH_2CF_2$—, —$CF_2CF_2$—, —CH=N—, —N=CH—, —N=N—, —CH=$CR^0$—, —$CX^1=CX^2$—, —C≡C— or a single bond, in particular —O—, —S—, —C≡C—, —$CX^1=CX^2$— or a single bond, very preferably a group that is able to from a conjugated system, such as —C≡C— or —$CX^1=CX^2$—, or a single bond.

Typical groups Sp' are, for example, —$(CH_2)_p$—, —$(CH_2CH_2O)_q$—$CH_2CH_2$—, —$CH_2CH_2$—S—$CH_2CH_2$— or —$CH_2CH_2$—NH—$CH_2CH_2$— or —$(SiR^0R^{00}$—$O)_p$—, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

Further preferred are compounds with one or two groups P-Sp- or P*-Sp- wherein Sp is a single bond.

In case of compounds with two groups P-Sp or P*-Sp-, respectively, each of the groups P or P* and the spacer groups Sp can be identical or different.

Another preferred embodiment relates to compounds comprising one or more groups P*-Sp-, wherein P* is a group that can be converted to or substituted by a polymerizable group P as defined above. Preferably P* is a group that is less reactive than P, for example towards spontaneous polymerization. These compounds can be used for example as intermediates in the synthesis of polymerizable compounds of formula I having one or more groups P, or as a precursor material for polymerizable compounds which are too reactive to be stored or transported for longer periods of time. The group P* is preferably chosen such that it can easily be transformed into or substituted by a group P by known methods. For example, it can be a protected form of group P. Further preferred groups P* are for example —OH or silyl groups like —O—Si—$R^0R^{00}R^{000}$, for example —O—$Si(CH_3)_3$, —O—Si-(isopropyl)$_3$, —O—Si-(phenyl)$_3$, —O—Si—$(CH_3)_2$(phenyl), —O—$Si(CH_3)_2$(tert-butyl) or the like, which can be reacted e.g. into polymerizable (meth)acrylate end groups.

Side chain liquid crystal polymers (SCLCPs) obtained from the inventive compounds or mixtures by polymerization or copolymerisation have a backbone that is formed by the polymerizable group P.

The mono-, oligo- and polymers of the present invention can be synthesized according to or in analogy to methods that are known or described in the examples A further aspect of the invention relates to both the oxidised and reduced form of the compounds and materials according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centers in the material, with the corresponding counterions derived from the applied dopants. Suitable doping methods comprise for example exposure to a doping vapor at atmospheric pressure or at a reduced pressure, electrochemical doping in a solution containing a dopant, bringing a dopant into contact with the semiconductor material to be thermally diffused, and ion-implantation of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)$ $(SbCl_6^-)$, $(NO_2^+)$ $(BF_4^-)$, $AgClO_4$, $H_2IrCl_6$, La $(NO_3)_3 \cdot 6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds and materials of the present invention can be used as an organic "metal" in applications, for example, but not limited to, charge injection layers and ITO planarizing layers in organic light emitting diode applications, films for flat panel displays and touch screens, antistatic films, printed conductive substrates, patterns or tracts in electronic applications such as printed circuit boards and condensers.

A preferred embodiment of the present invention relates to mono-, oligo- and polymers of formula I and I1 and their preferred subformulae that are mesogenic or liquid crystalline, and very preferably comprise one or more polymerizable groups. Very preferred materials of this type are monomers and oligomers of formula I or I1 and their preferred subformulae wherein n is an integer from 1 to 15 and $R^7$ and/or $R^8$ denote P-Sp-.

These materials are particularly useful as semiconductors or charge transport materials, as they can be aligned into uniform highly ordered orientation in their liquid crystal phase by known techniques, thus exhibiting a higher degree of order that leads to particularly high charge carrier mobility. The highly ordered liquid crystal state can be fixed by in situ polymerization or crosslinking via the groups P to yield polymer films with high charge carrier mobility and high thermal, mechanical and chemical stability.

For example, if a device is made from a polymerizable liquid crystal material by polymerization in situ, the liquid crystal material preferably comprises one or more mono- or oligomers of formula I1 and its preferred subformulae wherein one or both of $R^7$ and $R^8$ denote P-Sp-. If a liquid crystal polymer is prepared first, for example by polymerization in solution, and the isolated polymer is used to make the device, the polymer is preferably made from a liquid crystal material comprising one or more mono- or oligomers of formula I1 and its preferred subformulae wherein one of $R^7$ and $R^8$ denotes P-Sp-.

It is also possible to copolymerize the polymerizable mono-, oligo- and polymers according to the present invention with other polymerizable mesogenic or liquid crystal monomers that are known from prior art, in order to induce or enhance liquid crystal phase behavior.

Thus, another aspect of the invention relates to a polymerizable liquid crystal material comprising one or more mono-, oligo- or polymers of the present invention as described above and below comprising at least one polymerizable group, and optionally comprising one or more further polymerizable compounds, wherein at least one of the polymerizable mono-, oligo- and polymers of the present invention and/or the further polymerizable compounds is mesogenic or liquid crystalline.

Particularly preferred are liquid crystal materials having a nematic and/or smectic phase. For FET applications smectic materials are especially preferred. For OLED applications nematic or smectic materials are especially preferred. Especially preferred are smectic A ($S_A$) phases, furthermore highly ordered smectic phases like the $S_B$, $S_E$, $S_G$ and $S_F$ phase.

Another aspect of the present invention relates to an anisotropic polymer film with charge transport properties obtainable from a polymerizable liquid crystal material as defined above that is aligned in its liquid crystal phase into macroscopically uniform orientation and polymerized or crosslinked to fix the oriented state.

Preferably polymerization is carried out as in-situ polymerization of a coated layer of the material, preferably during fabrication of the electronic or optical device comprising the inventive semiconductor material. In case of liquid crystal materials, these are preferably aligned in their liquid crystal state into homeotropic orientation prior to polymerization, where the conjugated pi-electron systems are orthogonal to the direction of charge transport. This ensures that the intermolecular distances are minimized and hence then energy required to transport charge between molecules is minimized. The molecules are then polymerized or crosslinked to fix the uniform orientation of the liquid crystal state. Alignment and curing are carried out in the liquid crystal phase or mesophase of the material. This technique is known in the art and is generally described for example in D. J. Broer, et al., Angew. Makromol. Chem. 183, (1990), 45-66

Alignment of the liquid crystal material can be achieved, for example, by treatment of the substrate onto which the material is coated, by shearing the material during or after coating, by application of a magnetic or electric field to the coated material, or by the addition of surface-active compounds to the liquid crystal material. Reviews of alignment techniques are given for example by I. Sage in "Thermotropic Liquid Crystals", edited by G. W. Gray, John Wiley & Sons, 1987, pages 75-77, and by T. Uchida and H. Seki in "Liquid Crystals—Applications and Uses Vol. 3", edited by B. Bahadur, World Scientific Publishing, Singapore 1992, pages 1-63. A review of alignment materials and techniques is given by J. Cognard, Mol. Cryst. Liq. Cryst. 78, Supplement 1 (1981), pages 1-77.

Polymerization takes place by exposure to heat or actinic radiation. Actinic radiation means irradiation with light, like UV light, IR light or visible light, irradiation with X-rays or gamma rays or irradiation with high-energy particles, such as ions or electrons. Preferably polymerization is carried out by UV irradiation at a non-absorbing wavelength. As a source for actinic radiation for example a single UV lamp or a set of UV lamps can be used. When using a high lamp power the curing time can be reduced. Another possible source for actinic radiation is a laser, like e.g. a UV laser, an IR laser or a visible laser.

Polymerization is preferably carried out in the presence of an initiator absorbing at the wavelength of the actinic radiation. For example, when polymerizing by means of UV light, a photoinitiator can be used that decomposes under UV irradiation to produce free radicals or ions that start the polymerization reaction. When curing polymerizable materials with acrylate or methacrylate groups, preferably a radical photoinitiator is used, when curing polymerizable materials with vinyl, epoxide and oxetane groups, preferably a cationic photoinitiator is used. It is also possible to use a polymerization initiator that decomposes when heated to produce free radicals or ions that start the polymerization. As a photoinitiator for radical polymerization for example the commercially available Irgacure 651, Irgacure 184, Darocure 1173 or Darocure 4205 (all from Ciba Geigy AG) can be used, whereas in case of cationic photopolymerization the commercially available UVI 6974 (Union Carbide) can be used.

The polymerizable material can additionally comprise one or more other suitable components such as, for example, catalysts, sensitizers, stabilizers, inhibitors, chain-transfer agents, co-reacting monomers, surface-active compounds, lubricating agents, wetting agents, dispersing agents, hydrophobing agents, adhesive agents, flow improvers, defoaming agents, deaerators, diluents, reactive diluents, auxiliaries, colorants, dyes or pigments.

Mono-, oligo- and polymers comprising one or more groups P-Sp- can also be copolymerized with polymerizable mesogenic compounds to induce or enhance liquid crystal phase behavior. Polymerizable mesogenic compounds that are suitable as comonomers are known in prior art and disclosed for example in WO 93/22397; EP 0,261,712; DE 195, 04,224; WO 95/22586 and WO 97/00600.

Another aspect of the invention relates to a liquid crystal side chain polymer (SCLCP) obtained from a polymerizable liquid crystal material as defined above by polymerization or polymeranaloguous reaction. Particularly preferred are SCLCPs obtained from one or more monomers of formula I1 and its preferred subformulae wherein one or both, preferably one, of $R^7$ and $R^8$ are a polymerizable or reactive group, or from a polymerizable mixture comprising one or more of said monomers.

Another aspect of the invention relates to an SCLCP obtained from one or more monomers of formula I1 and its preferred subformulae wherein one or both of $R^7$ and $R^8$ are a polymerizable group, or from a polymerizable liquid crystal mixture as defined above, by copolymerization or polymeranaloguous reaction together with one or more additional mesogenic or non-mesogenic comonomers.

Side chain liquid crystal polymers or copolymers (SCLCPs), in which the semiconducting component is located as a pendant group, separated from a flexible backbone by an aliphatic spacer group, offer the possibility to obtain a highly ordered lamellar like morphology. This structure consists of closely packed conjugated aromatic mesogens, in which very close (typically <4 Å) pi-pi stacking can occur. This stacking allows intermolecular charge transport to occur more easily, leading to high charge carrier mobilities. SCLCPs are advantageous for specific applications as they can be readily synthesized before processing and then e.g. be processed from solution in an organic solvent. If SCLCPs are used in solutions, they can orient spontaneously when coated onto an appropriate surface and when at their mesophase temperature, which can result in large area, highly ordered domains.

SCLCPs can be prepared from the polymerizable compounds or mixtures according to the invention by the methods described above, or by conventional polymerization techniques which are known to those skilled in the art, including for example radicalic, anionic or cationic chain polymerization, polyaddition or polycondensation. Polymerization can be carried out for example as polymerization in solution, without the need of coating and prior alignment, or polymerization in situ. It is also possible to form SCLCPs by grafting compounds according to the invention with a suitable reactive group, or mixtures thereof, to presynthesized isotropic or anisotropic polymer backbones in a polymeranaloguous reaction. For example, compounds with a terminal hydroxy group can be attached to polymer backbones with lateral carboxylic acid or ester groups, compounds with terminal isocyanate groups can be added to backbones with free hydroxy groups, compounds with terminal vinyl or vinyloxy groups can be added, e.g., to polysiloxane backbones with Si—H groups. It is also possible to form SCLCPs by copolymerization or polymeranaloguous reaction from the inventive compounds together with conventional mesogenic or non-mesogenic comonomers. Suitable comonomers are known to those skilled in the art. In principle it is possible to use all conventional comonomers known in the art that carry a reactive or polymerizable group capable of undergoing the desired polymer-forming reaction, like for example a polymerizable or reactive group P as defined above. Typical mesogenic comonomers are for example those mentioned in WO 93/22397, EP 0 261 712, DE 195 04 224, WO 95/22586, WO 97/00600 and GB 2 351 734. Typical non-mesogenic comonomers are for example alkyl acrylates or alkyl methacrylates with alkyl groups of 1 to 20 C atoms, like methyl acrylate or methyl methacrylate.

The mono-, oligo- and polymers of the present invention are useful as optical, electronic and semiconductor materials, in particular as charge transport materials in field effect transistors (FETs), e.g., as components of integrated circuitry, ID tags or TFT applications. Alternatively, they may be used in organic light emitting diodes (OLEDs) in electroluminescent display applications or as backlight of, e.g., liquid crystal displays, as photovoltaics or sensor materials, for electrophotographic recording, and for other semiconductor applications.

Especially the oligomers and polymers according to the invention show advantageous solubility properties which allow production processes using solutions of these compounds. Thus films, including layers and coatings, may be generated by low cost production techniques, e.g., spin coating. Suitable solvents or solvent mixtures comprise alkanes and/or aromatics, especially their fluorinated derivatives.

The materials of the present invention are useful as optical, electronic and semiconductor materials, in particular as charge transport materials in field effect transistors (FETs), as photovoltaics or sensor materials, for electrophotographic recording, and for other semiconductor applications. Such FETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804, and from the references cited in the background and prior art section and listed below. Due to the advantages, like low cost production using the solubility properties of the compounds according to the invention and thus the processibility of large surfaces, preferred applications of these FETs are such as integrated circuitry, TFT-displays and security applications.

In security applications, field effect transistors and other devices with semiconductive materials, like transistors or diodes, may be used for ID tags or security markings to authenticate and prevent counterfeiting of documents of value like banknotes, credit cards or ID cards, national ID documents, licenses or any product with monetary value, like stamps, tickets, shares, checks etc.

Alternatively, the mono-, oligo- and polymers according to the invention may be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the inventive compounds, materials or films, especially those which show photoluminescent properties, may be employed as materials of light sources, e.g., of display devices such as described in EP 0 889 350 A1 or by C. Weder et al., Science, 279, 1998, 835-837.

According to another use, the inventive compounds, materials or films can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarization charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerizable compounds and/or chromophores for use in or as photoalignment layers, as described in US 2003/0021913.

According to another use the materials and polymers according to the present invention, especially their water-soluble derivatives (for example with polar or ionic side groups) or ironically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, Proc. Natl. Acad. Sci. U.S.A. 1999, 96, 12287; D. Wang, X. Gong, P. S. Heeger, F. Rininsland, G. C. Bazan and A. J. Heeger, Proc. Natl. Acad. Sci. U.S.A. 2002, 99, 49; N. DiCesare, M. R. Pinot, K. S. Schanze and J. R. Lakowicz, Langmuir 2002, 18, 7785; D. T. McQuade, A. E. Pullen, T. M. Swager, Chem. Rev. 2000, 100, 2537.

The compounds and materials according to the present invention can also be used in cosmetic or pharmaceutical compositions, for example, in cosmetic compositions for hair treatment as disclosed in EP1 498 112A2.

The examples below serve to illustrate the invention without limiting it. In the foregoing and the following, all temperatures are given in degrees Celsius, and all percentages are by weight, unless stated otherwise.

The entire disclosures of all applications, patents and publications, cited above and below, and of corresponding of European Patent Application No. 05005348.7, filed Mar. 11, 2005, European Patent Application No. 05005467.5, filed Mar. 14, 2005, and U.S. Provisional Patent Application 60/661,490, filed Mar. 15, 2005, are hereby incorporated by reference.

EXAMPLE 1

Polymer 1 is prepared as described below:

2,5-Bis(trimethylstannyl)selenophene

To a solution of selenophene (7.4 g, 56.5 mmol) in a solution of anhydrous hexane (90 ml) and TMEDA (17.4 g, 150 mmol) at 0° C. under nitrogen is added a solution of n-BuLi (55 ml of a 2.5M solution in hexanes, 137.5 mmol) dropwise over 5 min. The resulting solution is refluxed for 30 min and then cooled to 0° C. and trimethyltin chloride (25.6 g, 129 mmol) is added at once as a solid. The resulting solution is allowed to warm to room temperature and stirred at that temperature for 20 h. The solution is quenched with water (100 ml), and ethyl acetate (100 ml) is added. The layers are separated and the organic layer is washed with further water (4×100 ml), brine (100 ml), dried ($Na_2SO_4$), filtered and concentrated under reduced pressure. The resulting solid is recrystallized from acetonitrile four times to afford the product as white needles (25.8 g, 83%). M/Z cluster centered at 456 ($M^+$). Found C, 26.3; H, 4.6. Calc. for $C_{10}H_{20}SeSn_2$ C, 26.3; H, 4.2. $^1$H NMR (300 MHz, $CDCl_3$) δ 7.68 (s, 2H), 0.37 (s, 18H). $^{13}$C NMR (75 MHz, $CDCl_3$) δ 150.2, 138.7, −7.7.

5,5'-Dibromo-4,4'-bis(decyl)-2,2'-bithiophene 4,4'-Bis(decyl)-2,2'-bithiophene is prepared in analogy to the published procedure (see M. Zagorska and B. Krische Polymer, 1990, 31, p 1379).

To a solution of 4,4'-bis(decyl)-2,2'-bithiophene (6.60 g, 14.8 mmol) in chloroform (100 ml) and glacial acetic acid (100 ml) at 5° C. in the dark is added N-bromosuccinimde (5.40 g, 30 mmol) portionwise over 1 h. The resulting solution is warmed to 20° C. and stirred for a further 16 h. The solvent is removed under reduced pressure and the residue suspended in MTBE (200 ml). Filtration of the solution removed succinimde byproduct. The filtrate is washed with 5% sodium carbonate (100 ml), water (100 ml) and brine (100 ml), dried (sodium sulfate), filtered and concentrated under reduced pressure. The resulting crude product is further purified by reverse phase column chromatography over RP18 silica (23 g) eluting with acetonitrile/THF 2:1. A final recrystallization from ethyl acetate affords the product (2.94 g). HRMS 602.1248 (calc. for $C_{28}H_{44}S_2Br^{79}{}_2$ 602.1251). $^1$H NMR (300 MHz, CDCl$_3$) δ 6.77 (s, 2H), 2.70 (t, 4H), 1.57 (quint, 4H), 1.28 (m, 28H), 0.88 (t, 6H). $^{13}$C NMR (75 MHz, CDCl$_3$) δ 143.0, 136.1, 124.5, 107.9, 31.9, 29.62, 29.57, 29.40, 29.35, 29.2, 22.7, 14.2.

Poly(2,5-bis(3-decylthiophen-2-yl)selenophene) [1]

A 20 ml glass vial is charged with a stirrer bar, 5,5'-dibromo-4,4'-bis(decyl)-2,2'-bithiophene (604.6 mg, 1 mmol), 2,5-bis-trimethylstannylselenophene (456.6 mg, 1 mmol), tris(dibenzylideneacetone)dipalladium (0) (18.3 mg, 0.02 mmol, 4 mol % Pd), tri(o-tolyl)phosphine (24.4 mg, 0.08 mmol, 8 mol %) and chlorobenzene (15 ml). The glass vial is purged with nitrogen and securely sealed. The glass vial is placed into a microwave reactor (Emrys Creator, Personal Chemistry Ltd) and heated sequentially to 140° C. for 1 min, then 160° C. for 1 min and finally to 185° C. for 20 min. After cooling to RT, the reaction mixture is precipitated into a mixture of methanol (150 mL) and 37% hydrochloric acid (15 mL), and stirred for 14 h. The polymer is filtered, washed with methanol, and dried under vacuum. The polymer is washed (via Soxhlet extraction) with methanol ((6 h), acetone (24 h) and hexane (24 h). The resulting polymer is dissolved in hot chloroform (50 ml), filtered and precipitated into methanol, to afford the product (540 mg). GPC (Chlorobenzene, 60° C.) Mn (127,100 g/mol), Mw (58,700 g/mol). $\lambda_{max}$ 570 nm (solid film). $^1$H NMR (300 MHz, 50° C., CDCl$_3$) δ 7.25 (s, 2H, obscured by CHCl$_3$ peak) 7.01 (s, 2H), 2.76 (t, 4H), 1.70 (m, 4H), 1.45-1.20 (m, 28H), 0.88 (t, 6H).

EXAMPLE 2

Polymer 2 is prepared as described below:

5,5'-Dibromo-4,4'-bis(dodecyl)-2,2'-bithiophene 4,4'-Bis(dodecyl)-2,2'-bithiophene is prepared in analogy to the published procedure (see M. Zagorska and B. Krische Polymer, 1990, 31, p 1379).

To a solution of 4,4'-bis(dodecyl)-2,2'-bithiophene (28.8 g, 57.3 mmol) in chloroform (200 ml) and glacial acetic acid (200 ml) at 25° C. in the dark is added N-bromosuccinimde (19.88 g, 111.7 mmol) portionwise over 1 h. The resulting solution is stirred for 6 h. The solvent is removed under reduced pressure and the residue dissolved in a mixture of dichloromethane (1000 ml) and water (500 ml). The organic layer is separated and the aqueous layer extracted with dichloromethane (500 ml). The combined organics were washed with 5% sodium carbonate (500 ml), water (500 ml) and brine (500 ml), dried (sodium sulfate), filtered and concentrated under reduced pressure. The resulting crude product is filtered through a plug of silica (eluent: petrol 40-60° C.) and concentrated under reduced pressure. Recrystallization from butanone afforded the product (43.1 g, 73%) as pale yellow crystals. M/Z 660 (M+). Found C, 58.1; H, 7.9; S, 9.2. Calc. for $C_{32}H_{52}S_2Br_2$ C, 58.2; H, 7.9; S, 9.7. $^1$H NMR (300 MHz, CDCl$_3$) δ 6.77 (s, 2H), 2.51 (t, 4H), 1.57 (quint, 4H), 1.28 (m, 36H), 0.88 (t, 6H). $^{13}$C NMR (75 MHz, CDCl3) δ 142.8, 136.0, 124.3, 107.7, 31.8, 29.6 (2C), 29.5 (4C), 29.2 (2C), 29.0, 22.6, 14.0.

Poly(2,5-bis(3-dodecylthiophen-2-yl)selenophene) [2]

A 20 ml glass vial is charged with a stirrer bar, 5,5'-dibromo-4,4'-bis(dodecyl)-2,2'-bithiophene (660.7 mg, 1 mmol), 2,5-bis-trimethylstannylselenophene (466.6 mg, 1 mmol), tris(dibenzylideneacetone)dipalladium (0) (18.3 mg, 0.02 mmol, 4 mol % Pd), tri(o-tolyl)phosphine (24.4 mg, 0.08 mmol, 8 mol %) and chlorobenzene (15 ml). The glass vial is purged with nitrogen and securely sealed. The glass vial is placed into a microwave reactor (Emrys Creator, Personal Chemistry Ltd) and heated sequentially to 140° C. for 1 min, then 160° C. for 1 min and finally to 180° C. for 15 min. After cooling to RT, the reaction mixture is precipitated into a mixture of methanol (150 mL) and 37% hydrochloric acid (15 mL), and stirred for 14 h. The polymer is filtered, washed with methanol, and dried under vacuum. The polymer is washed (via Soxhlet extraction) with methanol (6 h), acetone (24 h) and hexane (24 h). The resulting polymer is dissolved in hot chlorobenzene (50 ml), filtered through a plug of silica (2 g) and precipitated into methanol at 60° C., to afford the product (466 mg). GPC (Chlorobenzene, 60° C.) Mn (23,800 g/mol), Mw (46,400 g/mol). $\lambda_{max}$ (solid film) 572, 620 (sh) nm. $\lambda_{max}$ (CHCl$_3$) 486 nm. $^1$H NMR (300 MHz, 50° C., CDCl$_3$) δ 7.25 (s, 2H, obscured by CHCl$_3$ peak) 7.01 (s, 2H), 2.75 (t, 4H), 1.70 (m, 4H), 1.45-1.20 (m, 36H), 0.87 (t, 6H).

EXAMPLE 3

Polymer 3 is prepared as described below:

4,4'-Bis(hexyl)-2,2'-biselenophene

3-Hexylselenophene is prepared according to the published procedure (C. Mahatsekake et al, Phosphorus, Sulfur and Silicon, 1990, 47, 35-41; 1.0 g, 4.64 mmol).

To a solution of 3-hexylselenophene (4.30 g, 20 mmol) and N,N,N',N'-tetramethylethylenediamine (2.44 g, 21 mmol) in anhydrous THF (25 ml) at −40° C. is added n-BuLi (8.5 ml of a 2.5M solution in hexanes, 21.3 mmol). The solution is allowed to warm to 25° C. over 30 min, and stirred at 25° C. for 45 min. The resulting solution is cooled to −20° C. and copper(II) chloride (2.96 g, 22 mmol) is added at once as a solid. The reaction is stirred at 25° C. for a further 16 h, and quenched by the addition of 5% HCl (50 ml). The organics were extracted with ethyl acetate (3×50 ml). The combined organics were washed with 5% HCl (2×50 ml), water (50 ml) and saturated sodium chloride (50 ml), dried (Na$_2$SO$_4$), filtered and concentrated under reduced pressure. The resulting oil is further purified by column chromatography over silica (eluant: petrol 40-60° C.). The first fraction contained 3-hexylselenophene and the second fraction contained the product. Recrystallization from THF/acetonitrile at −70° C. afforded the product as a white solid. M/Z 430 (M+). $^1$H NMR (300 MHz, CDCl3) δ 7.36 (s, 2H), 7.11 (s, 2H), 2.52 (t, 4H), 1.60 (quint, 4H), 1.30 (m, 12H), 0.89 (t, 6H). $^{13}$C NMR (75 MHz, CDCl3) δ 145.9, 144.0, 128.3, 122.9, 32.3, 31.7, 30.2, 29.0, 22.7, 14.2.

5,5'-Dibromo-4,4'-bis(hexyl)-2,2'-biselenophene

To a solution of 4,4'-bis(hexyl)-2,2'-biselenophene (1.0 g, 2.33 mmol) in tetrahydrofuran (25 ml) at 25° C. in the dark is added N-bromosuccinimde (0.84 g, 4.72 mmol) in two portions over 30 min. The resulting solution is stirred for 6 h. The solvent is removed under reduced pressure and the residue dissolved in ethyl acetate (50 ml) washed with water (2×30 ml) and saturated sodium chloride (30 ml), filtered and concentrated under reduced pressure. The resulting crude product is filtered through a plug of silica (eluent: petrol 40-60° C.) and concentrated under reduced pressure. Recrystallization from ethanol afforded the product (0.75 g, 55%) as white crystals. M/Z triplet centered at 456 (M+). $^1$H NMR (300 MHz, CDCl3) δ 6.84 (s, 2H), 2.48 (t, 4H), 1.55 (quint, 4H), 1.3 (m, 12H), 0.89 (t, 6H). $^{13}$C NMR (75 MHz, CDCl3) δ 145.3, 142.9, 127.7, 110.3, 31.6, 30.9, 39.6, 29.6, 22.6, 14.2.

Poly(2,5-bis(3-hexylselophen-2-yl)thiophene) [3]

A 10 ml glass vial is charged with a stirrer bar, 5,5'-dibromo-4,4'-bis(hexyl)-2,2'-biselenophene (300 mg, 0.512 mmol), 2,5-bis-trimethylstannylthiophene (209.7 mg, 0.512 mmol), tris(dibenzylideneacetone)dipalladium (0) (9.37 mg, 0.01 mmol, 4 mol % Pd), tri(o-tolyl)phosphine (12.46 mg, 0.04 mmol, 8 mol %) and chlorobenzene (5 ml). The glass vial is purged with nitrogen and securely sealed. The glass vial is placed into a microwave reactor (Emrys Creator, Personal Chemistry Ltd) and heated sequentially to 140° C. for 1 min, then 160° C. for 1 min and finally to 180° C. for 15 min. After cooling to RT, the reaction mixture is precipitated into a mixture of methanol (50 mL) and 37% hydrochloric acid (5 mL), and stirred for 14 h. The polymer is filtered, washed (via Soxhlet extraction) with methanol (6 h), acetone (24 h) and isohexane (24 h). The resulting polymer is dissolved in hot chloroform and precipitated into methanol to afford the product (210 mg). GPC (Chlorobenzene, 60° C.) Mn (12,700 g/mol), Mw (26,000 g/mol). λ$_{max}$ (solid film) 550, 578 (sh), 628 (sh) nm. λ$_{max}$ (CHCl$_3$) 483 nm. $^1$H NMR (300 MHz, 50° C., CDCl$_3$) δ 7.11 (s, 2H), 7.01 (s, 2H), 2.73 (t, 4H), 1.68 (m, 4H), 1.45-1.20 (m, 12H), 0.90 (t, 6H).

EXAMPLE 4

Polymer 4 is prepared as described below:

Poly(2,5-bis(3-hexylselophen-2-yl)thiophene) [4]

A 10 ml glass vial is charged with a stirrer bar, 5,5'-dibromo-4,4'-bis(hexyl)-2,2'-biselenophene (300 mg, 0.512 mmol), 5,5'-bis-trimethylstannyl-[2,2']bithiophenyl (251.7 mg, 0.512 mmol), tris(dibenzylideneacetone)dipalladium (0) (9.37 mg, 0.01 mmol, 4 mol % Pd), tri(o-tolyl)phosphine (12.46 mg, 0.04 mmol, 8 mol %) and chlorobenzene (6 ml). The glass vial is purged with nitrogen and securely sealed. The glass vial is placed into a microwave reactor (Emrys Creator, Personal Chemistry Ltd) and heated sequentially to 140° C. for 1 min, then 160° C. for 1 min and finally to 190° C. for 15 min. After cooling to RT, the reaction mixture is precipitated into a mixture of methanol (50 mL) and 37% hydrochloric acid (5 mL), and stirred for 14 h. The polymer is filtered, washed (via Soxhlet extraction) with methanol (6 h), acetone (16 h) and isohexane (16 h). The resulting polymer is dissolved in hot chloroform and precipitated into methanol to afford the product (230 mg). GPC (Chlorobenzene, 60° C.) Mn (18,500 g/mol), Mw (40,700 g/mol). $\lambda_{max}$ 544 nm (solid film). $\lambda_{max}$ 482 nm (CHCl$_3$) $^1$H NMR (300 MHz, 50° C., CDCl$_3$) δ 7.11 (br s, 4H), 6.98 (d, 2H), 2.73 (t, 4H), 1.68 (m, 4H), 1.45-1.20 (m, 12H), 0.90 (t, 6H).

EXAMPLE 5

Polymer 5 is prepared as described below:

Poly(2,5-bis(3,4-didecylthiophen-2-yl)selenophene) [5]

A 10 ml glass vial is charged with a stirrer bar, 2,5-dibromo-3,4,-didecylthiophene (100 mg, 0.19 mmol), 2,5-bis-trimethylstannylselenophene (87.2 mg, 0.191 mmol), tris (dibenzylideneacetone)dipalladium (0) (3.5 mg, 0.004 mmol, 4 mol % Pd), tri(o-tolyl)phosphine (4.65 mg, 0.016 mmol, 8 mol %) and chlorobenzene (3 ml). The glass vial is purged with nitrogen and securely sealed. The glass vial is placed into a microwave reactor (Emrys Creator, Personal Chemistry Ltd) and heated sequentially to 140° C. for 2 min, then 160° C. for 2 min and finally to 180° C. for 15 min. After cooling to RT, the reaction mixture is precipitated into a mixture of methanol (75 mL) and 37% hydrochloric acid (25 mL), and stirred for 1.5 h. The polymer is filtered, washed (via Soxhlet extraction) with acetone (4 h). The resulting polymer is extracted with chloroform and concentrated under reduced pressure to afford the product (60 mg). GPC (Chlorobenzene, 60° C.) Mn (4,700 g/mol), Mw (7,000 g/mol). $\lambda_{max}$ 514 nm (solid film). $\lambda_{max}$ (CHCl$_3$) 454 nm $^1$H NMR (300 MHz, , THF-d$_8$) δ 7.33 (br s, 2H), 2.77 (br t, 4H), 1.63 (m, 4H), 1.4-1.2 (m, 28H), 0.9 (br t, 6H).

Transistor Fabrication and Measurement:

Thin-film organic field-effect transistors (OFETs) are fabricated on highly doped silicon substrates with thermally grown silicon oxide (SiO$_2$) insulating layer, where the substrate served as a common gate electrode. Transistor source-drain gold electrodes are photolithographically defined on the SiO$_2$ layer. Prior to organic semiconductor deposition, FET substrates are treated with a silylating agent hexamethyldisilazane (HMDS) or octyltrichlorosilane (OTS). Thin semiconductor films are then deposited by spin-coating polymer solutions in chloroform, xylene, chlorobenzene or dichlorobenzene (0.4-1.0 wt %) on FET substrates. The electrical characterization of the transistor devices, is carried out under ambient atmosphere using computer controlled Agilent 4155C Semiconductor Parameter Analyser.

Transistor characteristics are measured on films prepared by spin coating. The films are heated to 100° C. for 10 min under nitrogen to remove residual solvent, and then cooled to room temperature to measure the transistor characteristics.

Figure 1:
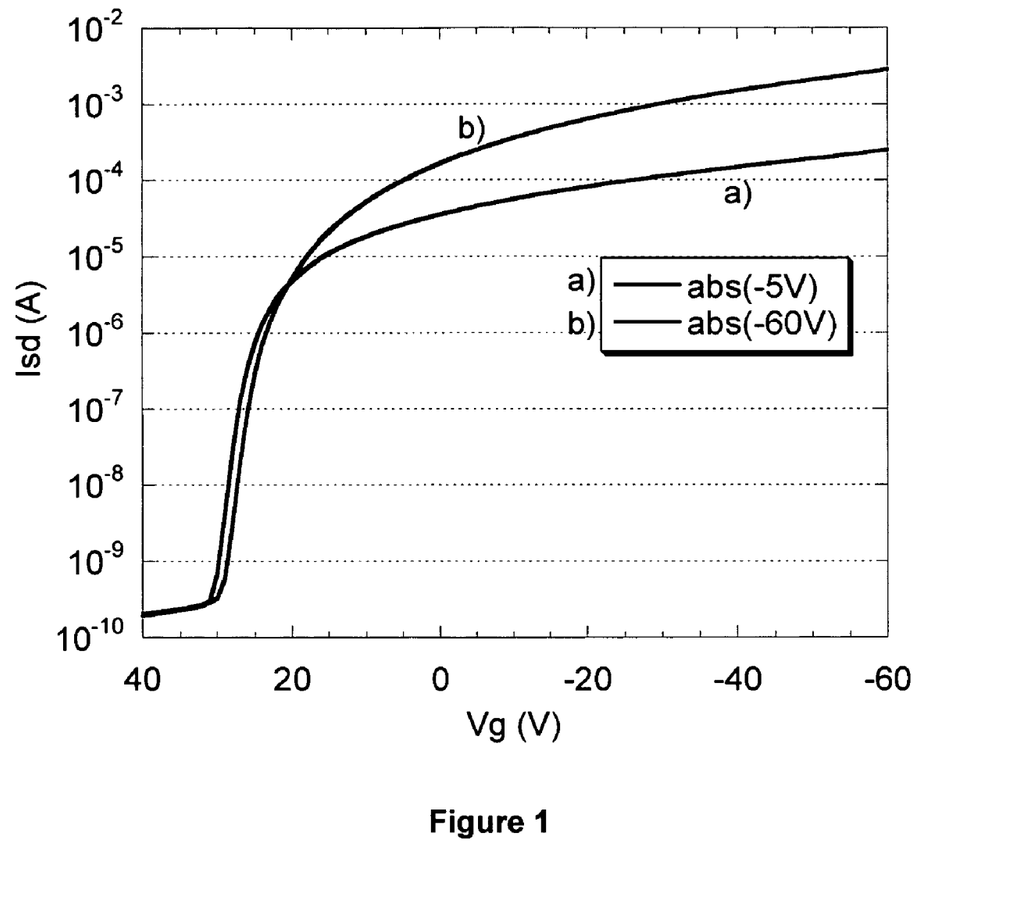
FIG. 1 shows the transfer characteristics of a polymer according to Example 1 in a transistor device.

FIG. 1 shows the current (I)-voltage (V) transfer characteristics of example 1 in a transistor device with 10 micron channel length and 20,000 micron channel width. The transistor gate voltage (V$_g$) is varied between 40 and −60 volts for two different setting of Source-Drain voltage (V$_{sd}$). The I$_{sd}$ is plotted versus V$_g$ for V$_{sd}$=−5V (line a) and −60 V (line b), respectively.

The devices show typical p-type behavior with good current modulation, and well-defined linear and saturation regimes. Field effect mobility is calculated in the saturation regime (V$_d$>(V$_g$−V$_0$)) using equation (1):

$$\left(\frac{dI_d^{sat}}{dV_g}\right)_{V_g} = \frac{WC_i}{L}\mu^{sat}(V_g - V_0) \quad (1)$$

where W is the channel width, L the channel length, C$_i$ the capacitance of insulating layer, V$_g$ the gate voltage, V$_d$ the drain voltage, I$_d$ is the drain current, V$_0$ the turn-on voltage and $\mu^{sat}$ is the saturated charge carrier mobility. The turn-on voltage (V$_0$) is determined as the onset of source-drain current (FIG. 1). The mobility values for compounds 1-3 are summarized in table 1.

TABLE 1

Summary of the electrical data for polymers 1-3.

| Compound | $\mu^{sat}$ (cm$^2$/Vs) | $\mu^{lin}$ (cm$^2$/Vs) | On/off |
|---|---|---|---|
| 1 | 0.1 | 0.04 | $10^6$ |
| 2 | 0.18 | 0.07 | $10^6$ |
| 3 | 0.01 | 0.004 | $10^6$ |

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. A monomeric, oligomeric or polymeric compound comprising one or more selenophene-2,5-diyl groups and one or more thiophene 2,5-diyl groups, each being optionally substituted in 3- and/or 4-position.

2. A compound according to claim 1, wherein said compound is of formula I wherein
R$^{1-6}$ are each, independently of each other, and in case of multiple occurrence independently of one another, H, halogen, optionally substituted aryl or heteroaryl, P-Sp-, P*-Sp-, or straight chain, branched or cyclic alkyl with 1 to 20 C-atoms, which is optionally mono- or polysubstituted by F, Cl, Br, I or CN, and wherein one or more non-adjacent CH$_2$ groups are optionally replaced, in each case independently from one another, by —O—, —S—, —NH—, —NR$^0$—, —SiR$^0$R$^{00}$—, —CO—, —COO—, —OCO—, —O—CO—O—, —S—CO—, —CO—S—, —CX$^1$=CX$^2$— or —C≡C— in such a manner that O and/or S atoms are not linked directly to one another, R$^0$ and R$^{00}$ are independently of each other H, aryl or alkyl with 1 to 12 C-atoms, X$^1$ and X$^2$ are independently of each other H, F, Cl or CN, P is a polymerizable group, P* is a group that can be converted to or substituted by a polymerizable group P,

Sp is a spacer group or a single bond, a, b, c and d are independently of each other 0, 1, 2 or 3, with a+c>1 and b+d>1, n is an integer ≥1, wherein the recurring units are identical or different.

3. A compound according to claim 1, wherein said compound is of formula I1 wherein R$^{1-6}$, a, b, c, d and n have the meanings of formula I,

R$^7$ and R$^8$ are each, independently of each other, H, halogen, optionally substituted aryl or heteroaryl, P-Sp-, P*-Sp-, or straight chain, branched or cyclic alkyl with 1 to 20 C-atoms, which is optionally mono- or polysubstituted by F, Cl, Br, I or CN, and wherein one or more non-adjacent CH$_2$ groups are optionally replaced, in each case independently from one another, by —O—, —S—, —NH—, —NR$^0$—, —SiR$^0$R$^{00}$—, —CO—, —COO—, —OCO—, —O—CO—O—, —S—CO—, —CO—S—, —CX$^1$=CX$^2$— or —C≡C— in such a manner that O and/or S atoms are not linked directly to one another, or

R$^7$ and R$^8$ are each, independently of each other, denote —Sn(R$^0$)$_3$, —B(OR')(OR''), —CH$_2$Cl, —CHO, —CH=CH$_2$ or —SiR$^0$R$^{00}$R$^{000}$,

R$^0$, R$^{00}$, R$^{000}$ are independently of each other H, aryl or alkyl with 1 to 12 C-atoms, R' and R'' are independently of each other H or alkyl with 1 to 12 C-atoms, or OR' and OR'' together with the boron atom form a cyclic group having 2 to 20 C atoms.

4. A compound according to claim 3, wherein said compound is of formula I1a-I1f:

-continued

5. A compound according to claim 2, wherein $R^3$, $R^4$, $R^5$ and $R^6$ are H and $R^1$ and $R^2$ are different from H.

6. A compound according to claim 2, wherein $R^1$ and $R^2$ are each, independently of one another, $C_1$-$C_{20}$-alkyl, $C_1$-$C_{20}$-alkoxy, $C_1$-$C_{20}$-alkenyl, $C_1$-$C_{20}$-alkynyl, $C_1$-$C_{20}$-thioalkyl, $C_1$-$C_{20}$-silyl, $C_1$-$C_{20}$-ester, $C_1$-$C_{20}$-amino or $C_1$-$C_{20}$-fluoroalkyl.

7. A compound according to claim 2, wherein $R^1$ and $R^2$ are each, independently of one another, $C_9$-$C_{20}$-alkyl, $C_9$-$C_{20}$-alkoxy, $C_9$-$C_{20}$-alkenyl, $C_9$-$C_{20}$-alkynyl, $C_9$-$C_{20}$-thioalkyl, $C_9$-$C_{20}$-silyl, $C_9$-$C_{20}$-ester, $C_9$-$C_{20}$-amino, $C_9$-$C_{20}$-fluoroalkyl, optionally substituted aryl, or optionally substituted heteroaryl.

8. A compound according to claim 2, wherein n is an integer from 2 to 5000.

9. A compound according to claim 3, wherein n is 1 and one or both of $R^7$ and $R^8$ is halogen, —Sn(R°)$_3$, —B(OR')(OR"), —CH$_2$Cl, —CHO, —CH═CH$_2$ or —SiR°R$^{00}$R$^{000}$.

10. A compound according to claim 3, wherein n is 1 and one or both of $R^7$ and $R^8$ are P-Sp- or P*-Sp-.

11. A compound according to claim 3, wherein said compound is formulae I1a1, I1a2, I1c1 or I1c2:

wherein R is in each case independently, halogen, optionally substituted aryl or heteroaryl, P-Sp-, P*-Sp-, or straight chain, branched or cyclic alkyl with 1 to 20 C-atoms, which is optionally mono- or polysubstituted by F, Cl, Br, I or CN, and wherein one or more non-adjacent CH$_2$ groups are optionally replaced, in each case independently from one another, by —O—, —S—, —NH—, —NR°—, —SiR°R$^{00}$—, —CO—, —COO—, —OCO—, —O—CO—O—, —S—CO, —CO—S—, —CX$^1$═CX$^2$— or —C≡C— in such a manner that O and/or S atoms are not linked directly to one another.

12. A compound according to claim 9, wherein $R^1$ and $R^2$ are each, independently of one another, $C_9$-$C_{20}$-alkyl or $C_9$-$C_{20}$-fluoroalkyl.

13. A polymerizable liquid crystal material comprising one or more thienothiophene compounds according to claim 1, said compounds comprising at least one polymerizable group, and said mixture optionally further comprising one or more further polymerizable compounds, wherein at least one of said thienothiophene compounds or said further polymerizable compounds is mesogenic or liquid crystalline.

14. An anisotropic polymer film with charge transport properties obtainable from a polymerizable liquid crystal material according to claim 13, wherein said film is aligned in its liquid crystal phase into macroscopically uniform orientation and polymerized or crosslinked to fix the oriented state.

15. A side chain liquid crystal polymer obtained by polymerization of one or more compounds or a polymerizable material according to claim 1 or by grafting said compounds or material to a polymer backbone in a polymeranaloguous reaction, optionally with one or more additional mesogenic or non-mesogenic comonomers.

16. In optical, electrooptical or electronic components or devices, in organic field effect transistors (OFET), integrated circuitry (IC), thin film transistors (TFT), flat panel displays, radio frequency identification (RFID) tags, electroluminescent or photoluminescent devices or components, in organic light emitting diodes (OLED), backlights of displays, photovoltaic or sensor devices, charge injection layers, Schottky diodes, planarizing layers, antistatic films, conducting substrates or patterns, in electrode materials in batteries, photoconductors, electrophotographic applications, electrophotographic recording, in organic memory devices, alignment layers, cosmetic or pharmaceutical compositions, biosensors, biochips, or in components and devices for detecting and discriminating DNA sequences, which in each case contains a charge transport, semiconducting, electrically conducting, photoconducting or light emitting material, the improvement comprising said material containing a compound according to claim 1.

17. A semiconducting, electroluminescent or charge transport material, component or device comprising at least one compound, according to claim 1.

18. An optical, electrooptical or electronic device, a field effect transistor (FET), integrated circuit (IC), TFT, OLED or alignment layer comprising a material, component or device according to claim 17.

19. A TFT or TFT array for flat panel displays, radio frequency identification (RFID) tag, electroluminescent display or backlight, comprising a material, component, or device according to claim 17.

20. A security marking or device comprising a FET or an RFID tag, wherein said FET or RFID tag, comprises a material, compound device according to claim 17.

21. A compound according to claim 1, which is oxidatively or reductively doped to form a conducting ionic species.

22. A charge injection layer, planarizing layer, antistatic film or conducting substrate or pattern for electronic applications or flat panel displays, comprising a compound according to claim 1.

23. A TFT or TFT array for flat panel displays, radio frequency identification (RFID) tag, electroluminescent display or backlight, comprising a FET, IC, TFT or OLED according to claim 18.

24. A compound according to claim 1 which is
poly(2,5-bis(3-decylthiophen-2-yl)selenophene),
poly(2,5-bis(3-dodecylthiophen-2-yl)selenophene),
poly(2,5-bis(3-hexylselophen-2-yl)thiophene),
poly(2,5-bis(3-hexylselophen-2-yl)thiophene) or
poly(2,5-bis(3,4-didecylthiophen-2-yl)selenophene).

25. A compound according to claim 2, with the proviso that compounds wherein a=b=c=1, d=0, $R^1$ and $R^2$ are n-$C_8H_{17}$, $R^3$, $R^4$, $R^5$ and $R^6$ are H, and n>1 are excluded.

26. A compound according to claim 3, with the proviso that compounds wherein a=b=c=1, d=0, $R^1$ and $R^2$ are n-$C_8H_{17}$, $R^3$, $R^4$, $R^5$ and $R^6$ are H, and n>1 are excluded.

27. A compound according to claim 2, wherein the optionally substituted aryl or heteroaryl groups are mono-, bi- or tricyclic aromatic or heteroaromatic groups comprising up to 25 C atoms, wherein the rings are optionally fused.

28. A compound according to claim 2, wherein the optionally substituted heteroaryl comprises at least one hetero ring atom which is N, O or S.

29. A compound of according to claim 2, wherein the optionally substituted aryl or heteroaryl groups are in each case, independently of one another, unsubstituted or substituted with one or more groups L, wherein L is F, Cl, Br, I, CN or straight chain, branched or cyclic alkyl having 1 to 20 C atoms, which is unsubstituted, mono- or poly-substituted by F, Cl, Br, I, —CN or —OH, and wherein one or more non-adjacent $CH_2$ groups are optionally replaced, in each case independently from one another, by —O—, —S—, —NH—, —$NR^0$—, —$SiR^0R^{00}$—, —CO—, —COO—, OCO—, —OCO—O, —S—CO—, —CO—S—, —CH=CH— or —C≡C— in such a manner that O and/or S atoms are not linked directly to one another.

30. A compound according to claim 2, wherein the heteroaryl comprises 1 or 2 heteroatoms.

31. A compound according to claim 2, wherein

P is $CH_2$=$CW^1$—COO—, $CH_2$=$CW^1$—CO—, $CH_2$=$CW^2$—(O)$_{k1}$—, $CH_3$—CH=CH—O—, ($CH_2$=CH)$_2$CH—OCO—, ($CH_2$=CH—$CH_2$)$_2$CH— OCO—, ($CH_2$=CH)$_2$CH—O—, ($CH_2$=CH—$CH_2$)$_2$N—, ($CH_2$=CH—$CH_2$)$_2$N—CO—, HO—$CW^2W^3$—, HS—$CW^2W^3$—, $HW^2$N—, HO—$CW^2W^3$—NH—, $CH_2$=$CW^1$—CO—NH—, $CH_2$=CH—(COO)$_{k1}$-Phe-(O)$_{k2}$—, $CH_2$=CH—(CO)$_{k1}$-Phe-(O)$_{k2}$—, Phe-CH=CH—, HOOC—, OCN—, or $W^4W^5W^6$Si—,
wherein $W^1$ is H, Cl, CN, $CF_3$, phenyl or alkyl with 1 to 5 C-atoms, $W^2$ and $W^3$ are each, independently of one another, H or alkyl with 1 to 5 C-atoms, $W^4$, $W^5$ and $W^6$ are each, independently of one another, Cl, oxaalkyl or oxacarbonylalkyl with 1 to 5 C-atoms, $W^7$ and $W^8$ are each, independently of one another, H, Cl or alkyl with 1 to 5 C-atoms, Phe is 1,4-phenylene that is optionally substituted by one or more groups L, L is F, Cl, Br, I, CN or straight chain, branched or cyclic alkyl having 1 to 20 C atoms, which is unsubstituted, mono- or poly-substituted by F, Cl, Br, I, —CN or —OH, and wherein one or more non-adjacent $CH_2$ groups are optionally replaced, in each case independently from one another, by —O—, —S—, —NH—, —$NR^0$—, —$SiR^0R^{00}$—, —CO—, —COO—, OCO—, —OCO—O, —S—CO—, —CO—S—, —CH=CH— or —C≡C— in such a manner that O and/or S atoms are not linked directly to one another, and

$k_1$ and $k_2$ are each, independently of one another, 0 or 1.

32. A compound according to claim 31, wherein $W^1$ is H, Cl or $CH_3$, and $W^2$ and $W^3$ are each, independently of one another, H, methyl, ethyl or n-propyl.

33. A compound according to claim 2, wherein P is $CH_2$=CH—COO—, $CH_2$=C($CH_3$)—COO—, $CH_2$=CH—, $CH_2$=CH—O—, ($CH_2$=CH)$_2$CH—OCO—, ($CH_2$=CH)$_2$CH—O—, 34. A compound according to claim 2, wherein Sp is of formula Sp'-X Sp' is alkylene with up to 20 C atoms which is unsubstituted or mono- or poly-substituted by F, Cl, Br, I or CN, wherein optionally one or more non-adjacent $CH_2$ groups are replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, and X is —O—, —S—, —CO—, —COO—, —OCO—, —O—COO—, —CO—NR⁰—, —NR⁰—CO—, —CO—NR⁰—CO—, —OCH₂—, —CH₂O—, —SCH₂—, —CH₂S—, —CF₂O—, —OCF₂—, —CF₂S—, —SCF₂—, —CF₂CH₂—, —CH₂CF₂—, —CF₂CF₂—, —CH=N—, —N=CH—, —N=N—, —CH=CR⁰—, —CX¹=CX²—, —C≡C—, —CH=CH—COO—, —OCO—CH=CH— or a single bond.

35. A compound according to claim 34, wherein X is —O—, —S—, —OCH₂—, —CH₂O—, —SCH₂—, —CH₂S—, —CF₂O—, —OCF₂—, —CF₂S—, —SCF₂—, —CH₂CH₂—, —CF₂CH₂—, —CH₂CF₂—, —CF₂CF₂—, —CH=N—, —N=CH—, —N=N—, —CH=CR⁰—, —CX¹=CX²—, —C≡C— or a single bond.

36. A compound according to claim 34, wherein X is —O—, —S—, —C≡C—, —CX¹=CX²— or a single bond.

37. A compound according to claim 34, wherein Sp' is ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene or butenylene.

38. A compound of according to claim 2, wherein
the optionally substituted aryl or heteroaryl groups are in each case, independently of one another, unsubstituted or substituted with one or more groups L, wherein L is F, Cl, Br, I, CN or straight chain, branched or cyclic alkyl having 1 to 20 C atoms, which is unsubstituted, mono- or poly-substituted by F, Cl, Br, I, —CN or —OH, and wherein one or more non-adjacent CH₂ groups are optionally replaced, in each case independently from one another, by —O—, —S—, —NH—, —NR⁰—, —SiR⁰R⁰⁰—, —CO—, —COO—, OCO—, —OCO—O, —S—CO—, —CO—S—, —CH=CH— or —C≡C— in such a manner that O and/or S atoms are not linked directly to one another, P is CH₂=CW¹—COO—, CH₂=CW¹—CO—, CH₂=CW²—(O)_{k1}—, CH₃—CH=CH—O—, (CH₂=CH)₂CH—OCO—, (CH₂=CH—CH₂)₂CH—OCO—, (CH₂=CH)₂CH—O—, (CH₂=CH—CH₂)₂N—, (CH₂=CH—CH₂)₂N—CO—, HO—CW²W³—, HS—CW²W³—, HW²N—, HO—CW²W³—NH—, CH₂CW¹—CO—NH—, CH₂=CH—(COO)_{k1}-Phe-(O)_{k2}—, CH₂=CH—(CO)_{k1}- Phe-(O)_{k2}—, Phe-CH=CH—, HOOC—, OCN—, or W⁴W⁵W⁶Si—,
wherein W¹ is H, Cl, CN, CF₃, phenyl or alkyl with 1 to 5 C-atoms, W² and W³ are each, independently of one another, H or alkyl with 1 to 5 C-atoms, W⁴, W⁵ and W⁶ are each, independently of one another, Cl, oxaalkyl or oxacarbonylalkyl with 1 to 5 C-atoms, W⁷ and W⁸ are each, independently of one another, H, Cl or alkyl with 1 to 5 C-atoms, Phe is 1,4-phenylene that is optionally substituted by one or more groups L, L is F, Cl, Br, I, CN or straight chain, branched or cyclic alkyl having 1 to 20 C atoms, which is unsubstituted, mono- or poly-substituted by F, Cl, Br, I, —CN or —OH, and wherein one or more non-adjacent CH₂ groups are optionally replaced, in each case independently from one another, by —O—, —S—, —NH—, —NR⁰—, —SiR⁰R⁰⁰—, —CO—, —COO—, OCO—, —OCO—O, —S—CO—, —CO—S—, —CH=CH— or —C≡C— in such a manner that O and/or S atoms are not linked directly to one another, and k₁ and k₂ are each, independently of one another, 0 or 1, Sp is of formula Sp'-X Sp' is alkylene with up to 20 C atoms which is unsubstituted or mono- or poly-substituted by F, Cl, Br, I or CN, wherein optionally one or more non-adjacent CH₂ groups are replaced, in each case independently from one another, by —O—, —S—, —NH—, —NR⁰—, —SiR⁰R⁰⁰—, —CO—, —COO—, —OCO—, —OCO—O, —S—CO—, —CO—S—, —CH=CH— or —C≡C— in such a manner that O and/or S atoms are not linked directly to one another, and X is —O—, —S—, —CO—, —COO—, —OCO—, —O—COO—, —CO—NR⁰—, —NR⁰—CO—, —CO—NR⁰—CO—, —OCH₂—, —CH₂O—, —SCH₂—, —CH₂S—, —CF₂O—, —OCF₂—, —CF₂S—, —SCF₂—, —CF₂CH₂—, —CH₂CF₂—, —CF₂CF₂—, —CH=N—, —N=CH—, —N=N—, —CH=CR⁰—, —CX¹=CX²—, —C≡C—, —CH=CH—COO—, —OCO—CH=CH— or a single bond.

* * * * *

UNITED STATES PATENT AND TRADEMARK OFFICE
CERTIFICATE OF CORRECTION

PATENT NO. : 7,470,377 B2  Page 1 of 1
APPLICATION NO. : 11/373491
DATED : December 30, 2008
INVENTOR(S) : Martin Heeney It is certified that error appears in the above-identified patent and that said Letters Patent is hereby corrected as shown below:

Column 24, line 29, delete "denote"
Column 25, line 51, reads "is formulate" should read -- is of formulae --
Column 26, line 28, reads "—S—CO," should read -- –S—CO—, --
Column 27, line 18, reads "tag, comprises" should read -- tag comprises --
Column 27, line 19, reads "compound device" should read -- compound or device --
Column 27, line 53, reads "compound of according" should read -- compound according --
Column 27, line 62, reads "OCO—," should read -- –OCO—, --
Column 27, line 63, reads "-OCO—O," should read -- –OCO—O—, --
Column 28, line 38, reads "OCO—," should read -- –OCO—, --
Column 28, line 39, reads "-OCO—O," should read -- –OCO—O—, --
Column 29, line 27, reads "compound of according" should read -- compound according --
Column 29, line 37, reads "OCO—," should read -- –OCO—, --
Column 29, lines 37-38, reads "-OCO—O," should read -- –OCO—O—, --
Column 30, line 26, reads "OCO—," should read -- –OCO—, --
Column 30, line 27, reads "-OCO—O," should read -- –OCO—O—, --
Column 30, line 29, delete line break after "and/or"

Signed and Sealed this

Twenty-sixth Day of January, 2010

David J. Kappos
*Director of the United States Patent and Trademark Office*